(12) United States Patent
Cheng

(10) Patent No.: US 11,239,074 B2
(45) Date of Patent: *Feb. 1, 2022

(54) GERMANIUM NANOSHEETS AND METHODS OF FORMING THE SAME

(71) Applicants: Taiwan Semiconductor Manufacturing Co., Ltd., Hsinchu (TW); National Taiwan University, Taipei (TW)

(72) Inventor: Hung-Hsiang Cheng, New Taipei (TW)

(73) Assignees: Taiwan Semiconductor Manufacturing Company, Ltd., Hsinchu (TW); National Taiwan University, Taipei (TW)

(*) Notice: Subject to any disclaimer, the term of this patent is extended or adjusted under 35 U.S.C. 154(b) by 0 days.

This patent is subject to a terminal disclaimer.

(21) Appl. No.: 16/598,305

(22) Filed: Oct. 10, 2019

(65) Prior Publication Data

US 2020/0051814 A1 Feb. 13, 2020

Related U.S. Application Data

(63) Continuation of application No. 16/408,273, filed on May 9, 2019, now Pat. No. 11,031,239.

(60) Provisional application No. 62/692,362, filed on Jun. 29, 2018.

(51) Int. Cl.
*H01L 21/02* (2006.01)
*B82Y 40/00* (2011.01)
*B82Y 30/00* (2011.01)

(52) U.S. Cl.
CPC .. *H01L 21/02381* (2013.01); *H01L 21/02384* (2013.01); *B82Y 30/00* (2013.01); *B82Y 40/00* (2013.01)

(58) Field of Classification Search
None
See application file for complete search history.

(56) References Cited

U.S. PATENT DOCUMENTS

| | | |
|---|---|---|
| 9,236,267 B2 | 1/2016 | De et al. |
| 9,502,265 B1 | 11/2016 | Jiang et al. |
| 9,520,466 B2 | 12/2016 | Holland et al. |
| 9,520,482 B1 | 12/2016 | Chang et al. |
| 9,536,738 B2 | 1/2017 | Huang et al. |
| 9,570,609 B2 | 2/2017 | Obradovic et al. |
| 9,576,814 B2 | 2/2017 | Wu et al. |
| 9,608,116 B2 | 3/2017 | Ching et al. |
| 9,653,289 B1 | 5/2017 | Balakrishnan et al. |
| 9,653,537 B1 | 5/2017 | Jagannathan et al. |
| 9,786,774 B2 | 10/2017 | Colinge et al. |
| 9,853,101 B2 | 12/2017 | Peng et al. |
| 9,881,993 B2 | 1/2018 | Ching et al. |
| 11,031,239 B2 * | 6/2021 | Cheng .............. H01L 21/02535 |

(Continued)

OTHER PUBLICATIONS

Loubet et al., "Stacked Nanosheet Gate-All-Around Transistor to Enable Scaling Beyond FinFET," Symposium on VLSI Technology Digest of Technical Papers, 2017, 2 pgs.

*Primary Examiner* — Xiaoming Liu
(74) *Attorney, Agent, or Firm* — Slater Matsil, LLP

(57) ABSTRACT

Devices comprising germanium nanosheets are described herein. Methods of forming such germanium nanosheets and devices including such germanium nanosheets are also described.

20 Claims, 19 Drawing Sheets

(56) References Cited

U.S. PATENT DOCUMENTS

| | | | |
|---|---|---|---|
| 2006/0216897 A1* | 9/2006 | Lee | B82Y 10/00 |
| | | | 438/282 |
| 2009/0315644 A1* | 12/2009 | Sheedy | H03H 9/2436 |
| | | | 333/186 |
| 2014/0264276 A1 | 9/2014 | Chang et al. | |
| 2015/0243733 A1* | 8/2015 | Yang | H01L 29/42392 |
| | | | 257/401 |
| 2016/0049489 A1* | 2/2016 | Wan | H01L 29/66545 |
| | | | 257/347 |
| 2017/0005176 A1 | 1/2017 | Sung et al. | |
| 2017/0110595 A1 | 4/2017 | Sengupta et al. | |
| 2017/0140933 A1* | 5/2017 | Lee | H01L 29/0649 |
| 2018/0083113 A1 | 3/2018 | Balakrishnan et al. | |
| 2019/0085240 A1 | 3/2019 | Liu et al. | |
| 2019/0097050 A1* | 3/2019 | Ebrish | H01L 29/785 |
| 2019/0103317 A1 | 4/2019 | Yu et al. | |

* cited by examiner

GERMANIUM NANOSHEETS AND METHODS OF FORMING THE SAME

PRIORITY CLAIM AND CROSS-REFERENCE

This application is a continuation of U.S. patent application Ser. No. 16/408,273, filed May 9, 2019 which claims the benefit of U.S. Provisional Patent Application No. 62/692,362, filed Jun. 29, 2018, which is incorporated by reference herein.

BACKGROUND

Transistors are building blocks for integrated circuits. Faster switching speed requires higher drive current, which drives down the gate lengths of transistors. Shorter gate length leads to undesirable "short-channel effects," in which the current control function of the gates are compromised. Various architectures, such as FinFETs and nanowires, have been developed to allow for shorter gate lengths, for example by overcoming the short-channel effects. As a further step toward improving the electrostatic control of the channels, transistors having a gate portion surrounding a semiconductor channel have been developed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 17A shows a perspective view of the sample with line A-A marked. FIG. 17B shows a perspective view of the cross section of the sample of FIG. 17A at line A-A. FIG. 17C shows a perspective view of the sample with line B-B marked. FIG. 17D shows a perspective view of the cross section of the sample of FIG. 17C at line B-B. FIG. 17E shows a perspective view of the sample with line C-C marked. FIG. 17F shows a perspective view of the cross section of the sample of FIG. 17E at line C-C.

DETAILED DESCRIPTION

Figure 1:
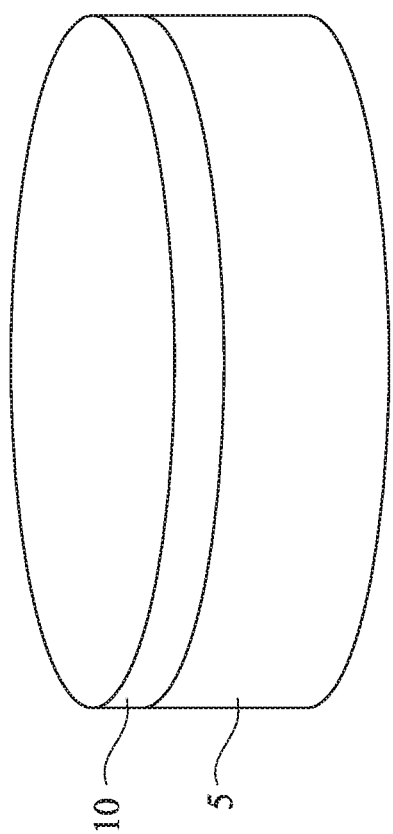
FIG. 1 illustrates a step of a method of forming a device of the disclosure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments described herein include germanium (Ge) nanosheets and semiconductor structures including germanium nanosheets. In some embodiments, such nanosheets are formed on any suitable substrate, including a silicon or germanium substrate. Such nanosheets can be used in high-speed electronic devices, e.g., semiconductor devices such as transistors. Germanium exhibits a larger electron or hole mobility as compared with silicon. Thus, devices including a germanium nanosheet in accordance with described embodiments exhibit improved performance as compared to performance of devices that include silicon-based nanosheets. The germanium nanosheets formed in accordance with embodiments described herein can therefore be used in complementary metal-oxide-semiconductor (CMOS) devices to improve performance. Example CMOS devices in which germanium nanosheets in accordance with embodiments described herein include logic devices, such as NAND gates, NOR gates, XOR gates and the like, memory devices, such as DRAM, SRAM, flip flops and the like.

The described germanium nanosheets provide improved performance in CMOS devices beyond the 7 nanometer (nm) node. For example, as compared to a conventional fin field effect transistor (FinFET) in the 7 nm node technology, FET's that include gate structures of the disclosed germanium nanosheets exhibit better gate control and larger drain current. Additionally, gate structures that include the described germanium nanosheets have excellent electrostatics and short channel control with minimal deviation. Use of the germanium nanosheets disclosed herein in the manufacture of semiconductor devices also circumvent some patterning challenges associated with manufacturing semiconductor devices using Si-based gate structures at this scale. Another benefit of the described germanium nanosheets is an increased effective width per active footprint.

Additional embodiments disclosed herein include methods of forming germanium nanosheets and semiconductor structures including germanium nanosheets. Such methods may include forming a germanium and group IV semiconductor multilayer. In some embodiments, such methods include forming a germanium and silicon-tin (SiSn) multilayer. In other embodiments, methods include forming a germanium and silicon-germanium-tin (SiGeSn) multilayer. In various embodiments, selective wet etching techniques are employed to remove portions of the group IV semiconductor layers of the multilayer.

FIGS. 1-11 illustrate steps of a method of forming a germanium nanosheet during intermediate operations of a method of fabricating a semiconductor device, in accordance with some embodiments of the present disclosure.

As shown in FIG. 1, a first layer 10 of a group IV semiconductor is formed on a surface of a substrate 5. Any suitable group IV semiconductor can be used. Specific examples are described below. In some embodiments, the first layer 10 is crystalline. In other embodiments, the first layer 10 is polycrystalline. In some embodiments, the group IV semiconductor is a compound group IV semiconductor.

In some embodiments, the group IV semiconductor comprises tin (Sn). In particular embodiments, the group IV semiconductor is a compound, such as silicon-tin (SiSn). In other embodiments, the group IV semiconductor is silicon-germanium-tin (SiGeSn).

In some embodiments where substrate 5 is a group IV compound semiconductor, the group IV compound semiconductor comprises tin in a concentration ranging from about 0.1% to about 25.5%. "About," as used herein, denotes that the actual value may be somewhat more or somewhat less than the stated value or range, to within ±20% of the stated value. In other embodiments, about means that the actual value is within ±15% of the stated value. In other embodiments, about means that the actual value is within ±10% of the stated value. In other embodiments, about means that the actual value is within ±5% of the stated value. In other embodiments, about means that the actual value is within ±1% of the stated value.

In some embodiments, the group IV semiconductor comprises tin in a concentration ranging from about 0.1% to about 20.3%. In some embodiments, the group IV semiconductor comprises tin in a concentration ranging from about 15% to about 20.3%. In other embodiments, the group IV semiconductor comprises tin in a concentration from about 15% to about 25.5%. In further embodiments, the group IV semiconductor comprises tin in a concentration ranging from about 20.3% to about 25.5%. In particular embodiments, the group IV semiconductor comprises tin in a concentration of about 20.3%.

In other embodiments, the group IV semiconductor comprises tin in a concentration of at least 25.5%. In other embodiments, the group IV semiconductor comprises tin in a concentration of no more than 0.1%. In further embodiments, the group IV semiconductor comprises tin in a concentration ranging from about 25.5% to about 30%.

In some embodiments, the group IV semiconductor is SiSn and comprises tin in a concentration ranging from about 15% to about 25.5%. In some embodiments, the group IV semiconductor is SiSn and comprises tin in a concentration ranging from about 20.3% to about 25.5%. In other embodiments, the group IV semiconductor is SiSn and comprises tin in a concentration ranging from about 15% to about 20.3%. In some embodiments, the group IV semiconductor is SiSn and comprises tin in a concentration of about 20.3%.

In some embodiments, the group IV semiconductor is SiGeSn and comprises tin in a concentration ranging from about 0.1% to about 25.5%. In some embodiments, the group IV semiconductor is SiGeSn and comprises tin in a concentration ranging from about 0.1% to about 20.3%.

In various embodiments, a strain between the first layer 10 and an adjacent layer is determined, at least in part, by the tin concentration in the first layer 10. The concentration of tin in the first layer 10 can therefore be modulated to induce strain in the adjacent layer. In some embodiments, the adjacent layers are further processed to form the channel region of a transistor. Thus, the concentration of tin in the first layer 10 can be modulated to adjust the strain in the channel region of the final transistor structure. In some embodiments, the heterostructure formed has a compressive strain. In some such embodiments, the compressive strain is about 1%. In other embodiments, the heterostructure formed has a tensile strain. In some such embodiments, the tensile strain is about 1%.

In some embodiments, a heterostructure has a lattice match (i.e., the lattice constant of the first layer 10 matches the lattice constant of the adjacent layer).

In some embodiments, the thickness of the first layer 10 is at least a bilayer (i.e., a layer that is at least two molecules thick). In some embodiments, the thickness of the first layer 10 is at least a trilayer (i.e., a layer that is at least three molecules thick). In some embodiments, the thickness of the first layer 10 is at least about 1 nm. In some embodiments, the thickness of the first layer 10 ranges from a bilayer to about 100 nm. In some embodiments, the thickness of the first layer 10 ranges from a trilayer to about 100 nm. In some embodiments, the thickness of the first layer 10 ranges from about 1 nm to about 100 nm. In various embodiments, the thickness of the first layer 10 ranges from about 10 nm to about 60 nm. In particular embodiments, the thickness of the first layer 10 ranges from about 20 nm to about 45 nm. In specific embodiments, the thickness of the first layer 10 is about 35 nm.

Suitable substrates 5 include a bulk silicon substrate. Alternatively, the substrate 5 comprises an elementary (single element) semiconductor, such as silicon or germanium in a crystalline structure; a compound semiconductor, such as silicon germanium, silicon carbide, gallium arsenide, gallium phosphide, indium phosphide, indium arsenide, and/or indium antimonide; or combinations thereof. In one or more embodiments, the substrate 5 can have multiple material layers, for example, a semiconductor-on-insulator substrate (SeOI), a silicon-on-insulator substrate (SOI) (which may be fabricated using separation by implantation of oxygen (SIMOX), wafer bonding and other suitable methods), germanium-on-insulator substrate (GeOI), or silicon-germanium-on-insulator substrate (SGOI), where an active surface semiconductor layer of a substrate 5 can be on a substrate insulator layer (e.g., buried oxide layer (BOX)). The substrate 5 can also have other layers forming the substrate, including high-k oxides and/or nitrides. In some embodiments, substrate 5 comprises germanium. In specific embodiments, substrate 5 is undoped germanium. In other embodiments, substrate 5 is a germanium-buffered Si wafer. The substrate may include an epitaxial layer and/or may be strained for performance enhancement. The substrate may also include various doping configurations depending on design requirements such as P-type substrate and/or N-type substrate and various doped regions such as P-wells and/or N-wells.

In one or more embodiments, substrate 5 may be crystalline, semi-crystalline, microcrystalline, or amorphous.

In various embodiments, the materials and layers are deposited by physical vapor deposition (PVD), chemical vapor deposition (CVD), atomic layer deposition (ALD), molecular beam epitaxy (MBE), or any of the various modifications thereof, for example, plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PEALD). The depositions can be epitaxial processes, and the deposited material can be crystalline. In various embodiments, formation of a layer may be by one or more deposition processes, where, for example, a conformal layer can be formed by a first process (e.g., ALD, PEALD, etc.) and a fill can be formed by a second process (e.g., CVD, electrodeposition, PVD, etc.).

The first layer 10 of the group IV semiconductor can be formed using any suitable methods (e.g., Molecular Beam Epitaxy (MBE), chemical vapor deposition (CVD), etc., described above). In various embodiments, the first layer 10 of the group IV semiconductor is formed by MBE. In particular embodiments, the first layer 10 of the group IV semiconductor is formed by CVD.

In various embodiments, the first layer 10 is formed at a low temperature which is below a temperature at which materials of other layers would reflow. In such embodiments, forming one or more layers of the methods described herein, e.g., the first layer 10, the low temperature prevents or minimizes reflow of materials, e.g., germanium, of other layers. In some embodiments, the first layer 10 is formed at a temperature ranging from about 120° C. to about 300° C.

Figure 2:
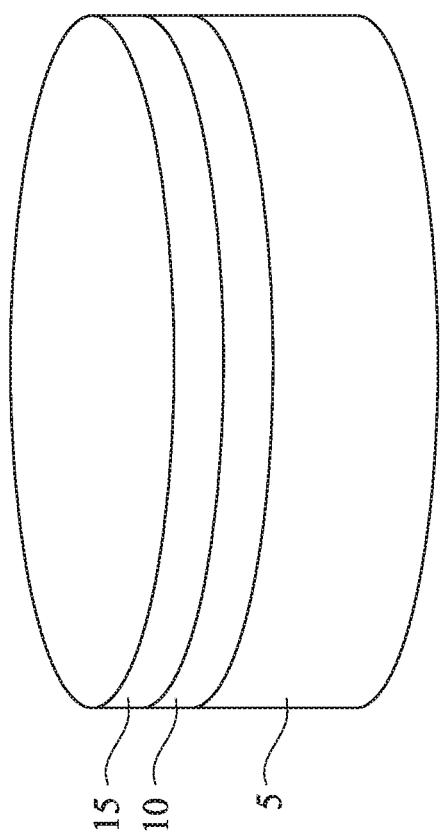
FIG. 2 illustrates a step of a method of forming a device of the disclosure, in accordance with some embodiments.

As shown in FIG. 2, in accordance with embodiments of the present disclosure, a second layer 15 of a group IV semiconductor is formed on the first layer 10. In some embodiments, the second layer 15 of the group IV semiconductor comprises germanium. In some embodiments, the group IV semiconductor of the second layer 15 is germanium.

In specific embodiments, the first layer 10 is SiSn and the second layer 15 is germanium. In other specific embodiments, the first layer 10 is SiGeSn and the second layer 15 is germanium. These combinations of first layer 10 and second layer 15 for a single heterostructure.

In some embodiments, the thickness of the second layer 15 is at least a bilayer. In some embodiments, the thickness of the second layer 15 is at least a trilayer. In some embodiments, the thickness of the second layer 15 is at least about 1 nm. In some embodiments, the thickness of the second layer 15 ranges from a bilayer to about 100 nm. In some embodiments, the thickness of the second layer 15 ranges from a trilayer to about 100 nm. In some embodiments, the thickness of the second layer 15 ranges from about 1 nm to about 100 nm. In various embodiments, the thickness of the second layer 15 ranges from about 10 nm to about 60 nm. In particular embodiments, the thickness of the second layer 15 ranges from about 20 nm to about 45 nm. In specific embodiments, the thickness of the second layer 15 is about 35 nm.

The second layer 15 may be formed using any suitable method, such as those described above. In various embodiments, the second layer 15 is formed by MBE. In particular embodiments, the second layer 15 is formed by CVD. In various embodiments, the second layer 15 is formed at a low temperature. In some embodiments, the second layer 15 is formed at a temperature ranging from about 120° C. to about 300° C.

In some embodiments of the methods described herein, the process now proceeds to the step illustrated in FIG. 5. In other words, a single heterostructure of the first layer 10 and the second layer 15 is formed and steps illustrated with reference to FIGS. 5-11 are carried out. Devices resulting from these embodiments include a single Ge nanosheet. In other embodiments, the process proceeds to the step illustrated in FIG. 3.

Figure 3:
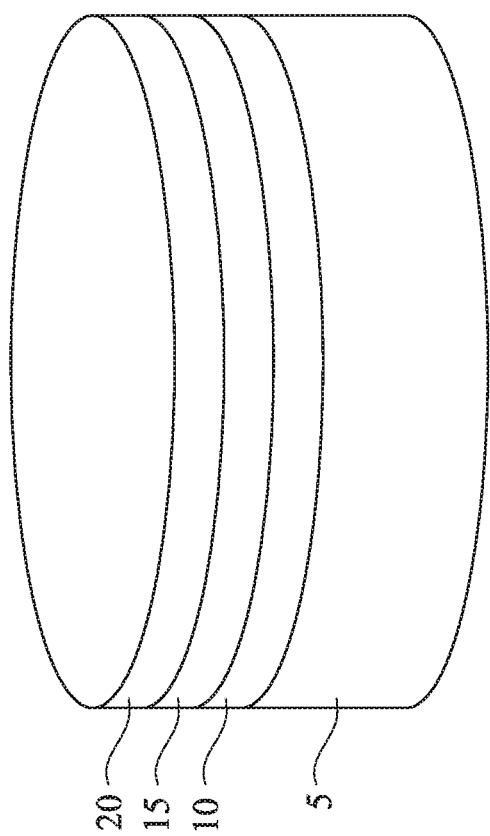
FIG. 3 illustrates a step of a method of forming a device of the disclosure, in accordance with some embodiments.

In accordance with embodiments illustrated in FIG. 3, a heterostructure 35 of alternating layers of germanium (e.g., first layer 10) and a Group IV semiconductor (e.g., second layer 15) is formed. In some embodiments, two sets of alternating layers are formed. In further embodiments, more than two sets of alternating layers are formed. In some embodiments, three sets of alternating layers are formed. In some embodiments, four sets of alternating layers are formed. In some embodiments, five sets of alternating layers are formed. In other embodiments, more than five sets of alternating layers are formed.

As shown in FIG. 3, a third layer 20 of a group IV semiconductor is formed on the second layer 15. Any suitable group IV semiconductor can be used. In some embodiments, the third layer 20 is crystalline. In other embodiments, the third layer 20 is polycrystalline. In some embodiments, the group IV semiconductor is a compound group IV semiconductor.

In some embodiments, the group IV semiconductor of the third layer 20 comprises tin. In particular embodiments, the group IV semiconductor of the third layer 20 is SiSn. In other embodiments, the group IV semiconductor of the third layer is SiGeSn. In specific embodiments, the group IV semiconductor of the third layer 20 is the same group IV semiconductor as the first layer 10.

In some embodiments, the group IV semiconductor of the third layer 20 comprises tin in a concentration ranging from about 0.1% to about 25.5%. In some embodiments, the group IV semiconductor of the third layer 20 comprises tin in a concentration ranging from about 0.1% to about 20.3%. In other embodiments, the group IV semiconductor of the third layer 20 comprises tin in a concentration ranging from about 15% to about 25.5%. In some embodiments, the group IV semiconductor of the third layer 20 comprises tin in a concentration ranging from about 15% to about 20.3%. In further embodiments, the group IV semiconductor of the third layer 20 comprises tin in a concentration ranging from about 20.3% to about 25.5%. In particular embodiments, the group IV semiconductor of the third layer 20 comprises tin in a concentration of about 20.3%.

In other embodiments, the group IV semiconductor of the third layer 20 comprises tin in a concentration of at least 25.5%. In other embodiments, the group IV semiconductor of the third layer 20 comprises tin in a concentration of no more than 0.1%. In further embodiments, the group IV semiconductor of the third layer 20 comprises tin in a concentration ranging from about 25.5% to about 30%.

In some embodiments, the group IV semiconductor of the third layer 20 is SiSn and comprises tin in a concentration ranging from about 15% to about 25.5%. In some embodiments, the group IV semiconductor of the third layer 20 is SiGeSn and comprises tin in a concentration ranging from about 0.1% to about 25.5%. In particular embodiments, the third layer 20 has the same composition as the first layer 10.

In various embodiments, a strain between the third layer 20 and an adjacent layer (e.g., the second layer 15) is determined, at least in part, by the tin concentration in the third layer 20. In some embodiments, a heterostructure has a lattice match (i.e., the lattice constant of third layer 20 matches the lattice constant of the second layer 15). In some embodiments, the group IV semiconductor is SiSn and comprises tin in a concentration of about 20.3%. In some embodiments, the group IV semiconductor is SiGeSn and comprises tin in a concentration ranging from about 0.1% to about 20.3%.

In some embodiments, the heterostructure formed has a compressive strain. In some such embodiments, the compressive strain is about 1%. In some embodiments, the group IV semiconductor is SiSn and comprises tin in a concentration ranging from about 20.3% to about 25.5%. In some embodiments, the group IV semiconductor is SiGeSn and comprises tin in a concentration ranging from about 0.1% to about 25.5%.

In other embodiments, the heterostructure formed has a tensile strain. In some such embodiments, the tensile strain is about 1%. In some embodiments, the group IV semiconductor is SiSn and comprises tin in a concentration ranging from about 15% to about 20.3%. In some embodiments, the group IV semiconductor is SiGeSn and comprises tin in a concentration ranging from about 0.1% to about 20.3%.

In some embodiments, the thickness of the third layer 20 is at least a bilayer. In some embodiments, the thickness of the third layer 20 is at least a trilayer. In some embodiments, the thickness of the third layer 20 is at least about 1 nm. In some embodiments, the thickness of the third layer 20 ranges from a bilayer to about 100 nm. In some embodiments, the thickness of the third layer 20 ranges from a trilayer to about 100 nm. In some embodiments, the thickness of the third layer 20 ranges from about 1 nm to about 100 nm. In various embodiments, the thickness of the third layer 20 ranges from about 10 nm to about 60 nm. In particular embodiments, the thickness of the third layer 20 ranges from about 20 nm to about 45 nm. In specific embodiments, the thickness of the third layer 20 is about 35 nm. In specific embodiments, the thickness of the third layer 20 is about the same as the thickness of the first layer 10. In other embodiments, the third layer 20 is thicker than the first layer 10.

The third layer 20 of the group IV semiconductor can be formed using any suitable methods (e.g., MBE, CVD, etc. as described above). In various embodiments, the third layer 20 of the group IV semiconductor is formed by MBE. In particular embodiments, the third layer 20 of the group IV semiconductor is formed by CVD.

In various embodiments, the third layer 20 is formed at a low temperature which is below a temperature at which other materials of the heterostructure reflow. In some embodiments, the third layer 20 is formed at a temperature ranging from about 120° C. to about 300° C. In specific embodiments, the third layer 20 is formed using the same method as the first layer 10.

Figure 4:
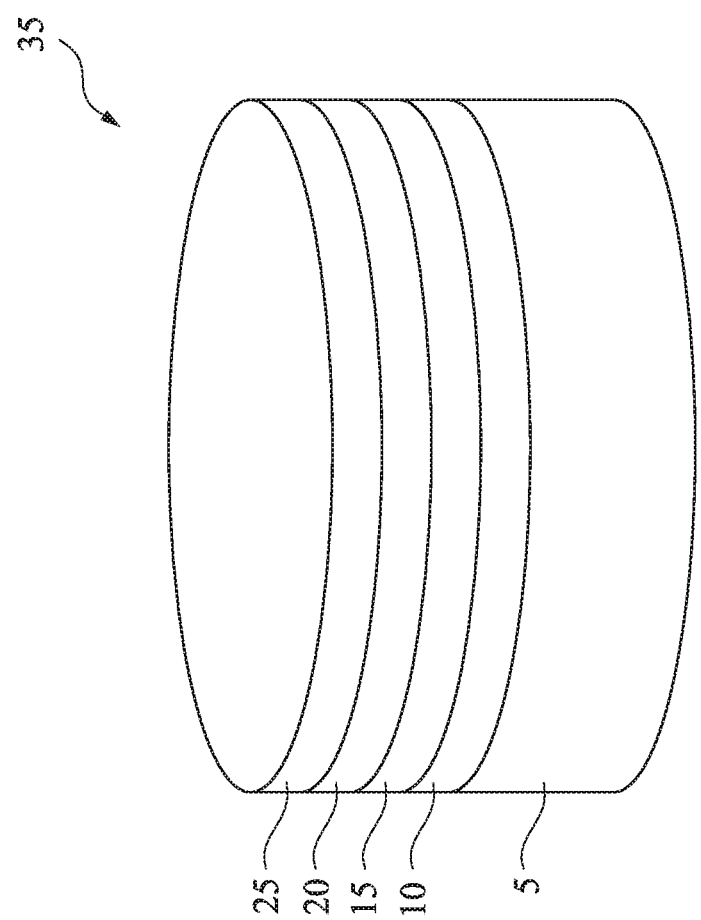
FIG. 4 illustrates a step of a method of forming a device of the disclosure, in accordance with some embodiments.

As shown in FIG. 4, a fourth layer 25 of a group IV semiconductor is formed on the third layer 20. In some embodiments, the fourth layer 25 of the group IV semiconductor comprises germanium. In some embodiments, the group IV semiconductor of the fourth layer 25 is germanium. In specific embodiments, the fourth layer 25 is the same group IV semiconductor as the second layer 15.

In some embodiments, the thickness of the fourth layer 25 is at least a bilayer. In some embodiments, the thickness of the fourth layer 25 is at least a trilayer. In some embodiments, the thickness of the fourth layer 25 is at least about 1 nm. In some embodiments, the thickness of the fourth layer 25 ranges from a bilayer to about 100 nm. In some embodiments, the thickness of the fourth layer 25 ranges from a trilayer to about 100 nm. In some embodiments, the thickness of the fourth layer 25 ranges from about 1 nm to about 100 nm. In various embodiments, the thickness of the fourth layer 25 ranges from about 10 nm to about 60 nm. In particular embodiments, the thickness of the fourth layer 25 ranges from about 20 nm to about 45 nm. In specific embodiments, the thickness of the fourth layer 25 is about 35 nm. In specific embodiments, the thickness of the fourth layer 25 is about the same as the thickness of the second layer 15. In other embodiments, the fourth layer 25 is thicker than the second layer 15.

The fourth layer 25 may be formed using any suitable method, such as those described above. In various embodiments, the fourth layer 25 is formed by MBE. In particular embodiments, the fourth layer 25 is formed by CVD. In various embodiments, the fourth layer 25 is formed at a low temperature. In some embodiments, the fourth layer 25 is formed at a temperature ranging from about 120° C. to about 300° C. In specific embodiments, the fourth layer 25 is formed using the same method as the second layer 15.

In various embodiments, additional layers of group IV semiconductors are formed on the fourth layer 25. In some embodiments, the layers alternate between a first type of layer (e.g., the first layer 10, the third layer 20, etc.) and a second type of layer (e.g., the second layer 15, the fourth layer 25, etc.). In some such embodiments, an even number of layers of group IV semiconductors are present.

In some embodiments, a multilayer is formed. In various embodiments, a multilayer of alternating SiSn and germanium layers (i.e., repeating SiSn and germanium heterostructures) is formed. In other embodiments, a multilayer of alternating SiGeSn and germanium layers is formed.

Figure 5A:
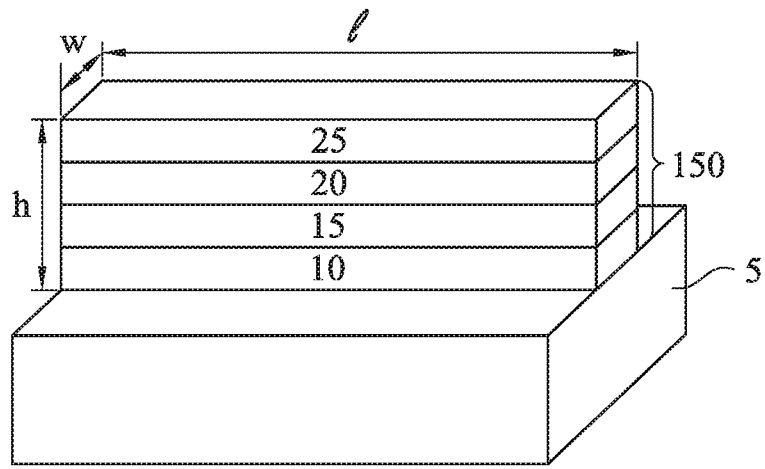
FIGS. 5A and 5B illustrate a step of a method of forming a device of the disclosure, in accordance with some embodiments.

FIG. 5A is a cross-sectional isometric view showing a plurality of patterned heterostructures including first layer 10 (e.g., group IV semiconductor such as SiSn or SiGeSn), second layer 15 (e.g., Ge), third layer 20 (e.g., group IV semiconductor such as SiSn or SiGeSn), and fourth layer 25 (e.g., Ge), in accordance with an embodiments of the present disclosure.

In one or more embodiments, a multilayer of alternating first through fourth layers 10, 15, 20, 25 is masked and patterned, as would be known in the art to form a nanosheet stack 150 having a long lateral dimension (i.e., length l), a short lateral dimension (i.e., width w), and a height h. A portion of the multilayer can be removed, for example, by a directional etch (e.g., reactive ion etch (RIE)) to form a stack 150. The directional etch may be a non-selective, timed RIE to remove unmasked portions of the multilayers through a single etching step, or alternating selective RIEs may be used to remove exposed portion(s) of each layer of the multilayer separately. In some embodiments, width w ranges from about 1 micrometer to about 10 micrometers. In other embodiments, the width w ranges from about 3 m to about 7 m. In various embodiments, w is about 5 m.

Figure 5B:
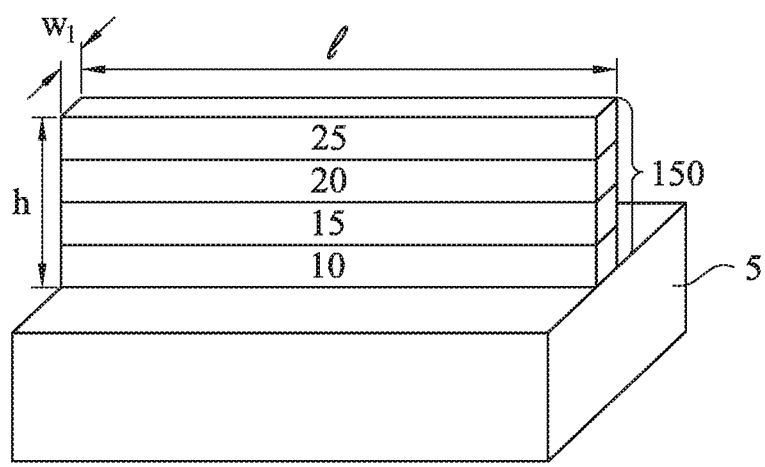

In accordance with embodiments of the present disclosure, further processing is performed to narrow the width of the multilayer stack 150 (i.e., decrease the width w). Any suitable technique may be used to shape (e.g., narrow) the width w to a narrower width $w_1$, such as focused ion beam (FIB). Referring to FIG. 5B, in various embodiments, the stack 150 is shaped by FIB. In some embodiments, the width $w_1$ of stack 150 ranges from about 1 nm to about 100 nm. In various embodiments, the width $w_1$ of the nanosheet stack 150 ranges from about 2 nm to about 20 nm. In some embodiments, the width $w_1$ of the stack 150 is no more than 10 nm. In particular embodiments, the width $w_1$ of the nanosheet stack 150 ranges from about 5 nm to about 10 nm. In specific embodiments, the width $w_1$ of the nanosheet stack 150 is no more than about 7 nm. In other embodiments, the width of the stack 150 is no more than about 5 nm.

In one or more embodiments described in more detail below, second layer 15 and fourth layer 25 form nanosheet channels in a nanosheet device (300 in FIG. 11).

Figure 6:
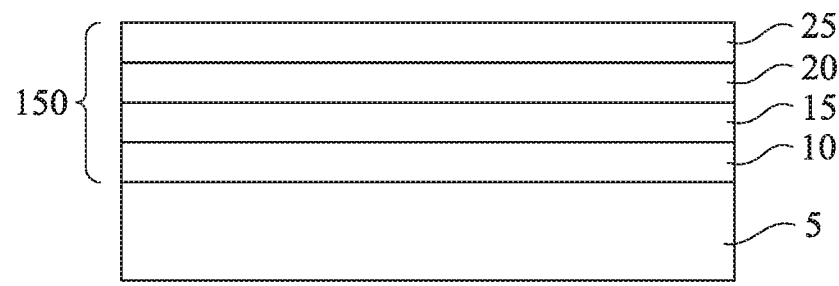
FIG. 6 illustrates a step of a method of forming a device of the disclosure, in accordance with some embodiments.

FIG. 6 is a cross-sectional side view showing a patterned multilayer of alternating first through fourth layers 10, 15, 20, 25 on a substrate 5, in accordance with an embodiment of the present invention.

In one or more embodiments, the patterned multilayer stack 150 is sufficiently long to form a one or more dummy gates on the multilayer stack 150. For embodiments where the multilayer stack is sufficiently long that more than one dummy gate can be formed on the multilayer stack 150, portions of the multilayer stack between dummy gates may be removed to form separate nano-sheet devices. In accordance with embodiments of the present disclosure, two or more dummy gates can be formed on the same multilayer stack 150.

Figure 7:
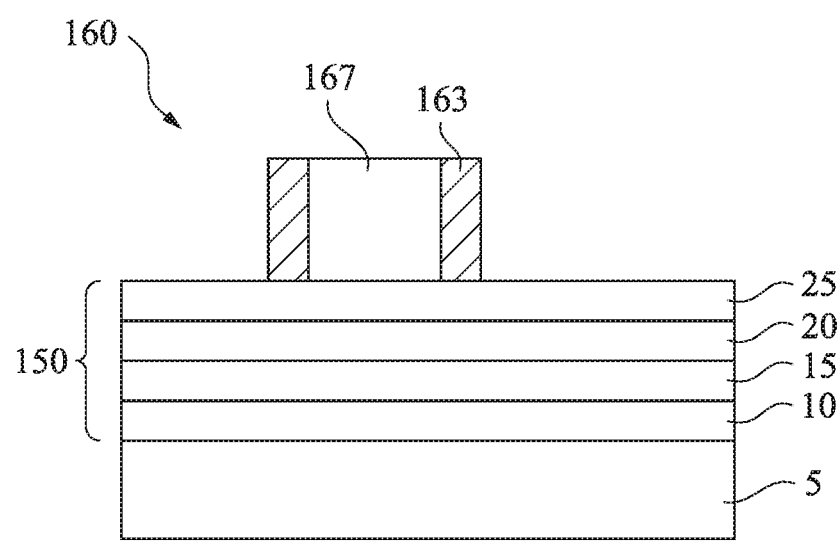
FIG. 7 illustrates a step of a method of forming a device of the disclosure, in accordance with some embodiments.

FIG. 7 is a cross-sectional side view of one dummy gate 160 with side spacers 163 on the multilayer stack 150, in accordance with an embodiment of the present invention. In one or more embodiments, a dummy gate 160 is formed on the multilayer stack 150. A dummy gate can include side spacers 163 and a dummy gate fill 167. The dummy gate 160 can be formed by processes known in the art, including masking, patterning, etching, deposition, and planarization processes/steps. In various embodiments, the dummy gate(s) 160 can be formed by a double patterning process (e.g., sidewall image transfer (SIT)). The side spacer 163 can be completely around the dummy gate fill 167.

In one or more embodiments, a dummy gate 160 can be formed on a multilayer stack 150, where the dummy gate 160 can be formed over three sides of the multilayer stack 150. In various embodiments, the dummy gate 160 can be a material that can be easily and selectively removed from the layers of the multilayer stack 150, including, but not limited to, poly-silicon (p-Si), amorphous silicon (a-Si), amorphous carbon (a-C), silicon oxide ($SiO_2$), silicon nitride (SiN), silicon oxynitride (SiON), and combinations thereof. In various embodiments, the dummy gate 160 may include multiple material layers (e.g., a capping layer), where the dummy gate can be a dummy gate stack.

In one or more embodiments, a side spacer 163 can be formed on the dummy gate fill 167. The side spacer 163 can be conformally deposited on the dummy gate fill 167 and exposed surfaces of the multilayer stack 150, and etched back using a directional etch (e.g. RIE) to expose the top surface of the dummy gate fill 167, the multilayer stack 150, and the substrate 5 surface, while remaining on the vertical surfaces of the dummy gate fill 167. In various embodiments, the side spacer 163 can be a silicon nitride (SiN), a silicon oxynitride (SiON), a silicon carbonitride (SiCN), a silicon boronitride (SiBN), a silicon borocarbide (SiBC), a silicon borocarbonitride (SiBCN), a boron carbide (BC), a boron nitride (BN), or combinations thereof, where the dummy gate fill 167 can be selectively etched relative to the side spacer 163.

Figure 8:
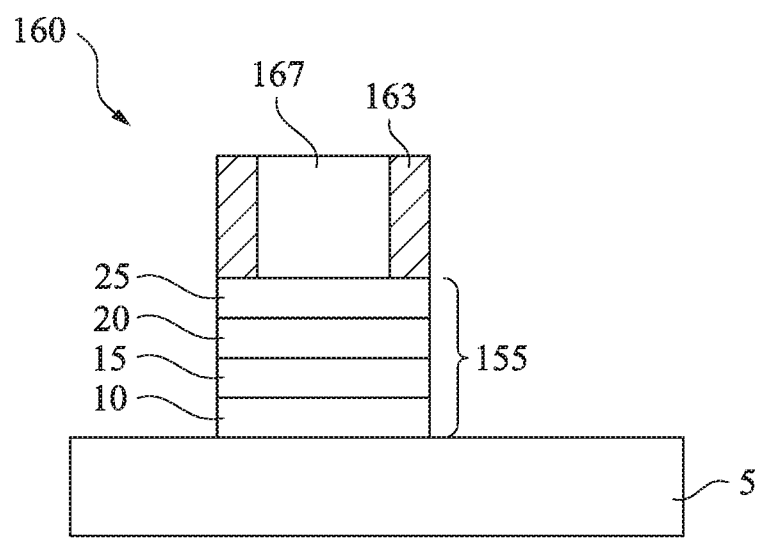
FIG. 8 illustrates a step of a method of forming a device of the disclosure, in accordance with some embodiments.

FIG. 8 is a cross-sectional side view showing a dummy gate on a cut-multilayer stack 150, in accordance with an embodiment of the present invention. In one or more embodiments, portions of the multilayer stack 150 exposed around dummy gate 160 is removed to form cut-multilayer stack 155, where the dummy gate masks the cut-multilayer stack, and the cut-multilayer stack 155 can have the same resulting lateral dimension as the dummy gate 160. The exposed portions of the multilayer stack 150 is removed using a directional etch (e.g., RIE) to form essentially vertical sides to the cut-multilayer stack 155. The cut-multilayer stack 155 includes the alternating first through fourth layers 10, 15, 20, 25, where the ends of the first through fourth layers are exposed.

Figure 9:
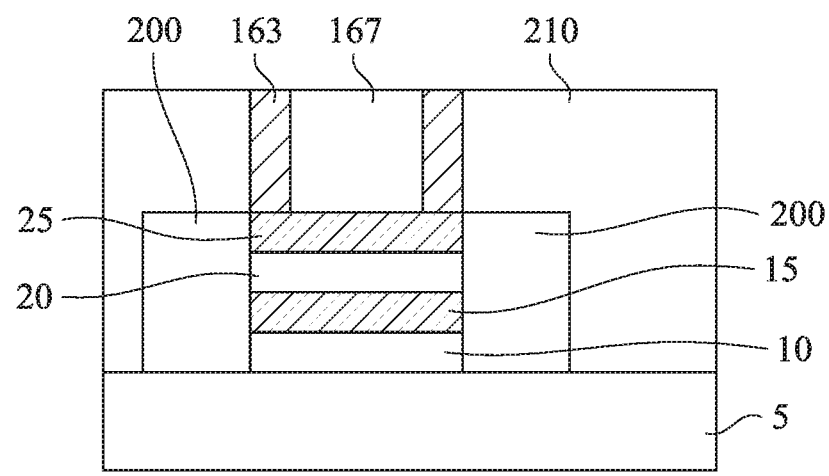
FIG. 9 illustrates a step of a method of forming a device of the disclosure, in accordance with some embodiments.

FIG. 9 is a cross-sectional side view of source/drains formed on the first through fourth layers 10, 15, 20, 25 on either side of each of the cut-multilayer stack 155, in accordance with an embodiment of the present disclosure. In one or more embodiments, a source/drain (S/D) regions 200 can be formed on the first through fourth layers 10, 15, 20, 25, where the source/drain regions 200 can be formed by an epitaxial growth process on exposed crystalline faces of the first through fourth layers 10, 15, 20, 25. The source/drain regions 200 can be in physical and electrical contact with each of the one or more first through fourth layers 10, 15, 20, 25 in the cut-multilayer stack 155.

In various embodiments, the source/drain region(s) 200 can be silicon or silicon-germanium suitably doped to form an n-type or a p-type field effect transistor (nFET or pFET). The S/D region(s) can be doped in situ (i.e., during formation). FIG. 9 also illustrates a cross-sectional side view of an interlayer dielectric 200 formed on the cut-multilayer stack 155, dummy gate 160 and S/D 200, in accordance with an embodiment of the present disclosure.

In one or more embodiments, an interlayer dielectric (ILD) 210 can be formed on the source/drain region(s) 200. The interlayer dielectric (ILD) 210 can be formed by a blanket deposition that covers the source/drain region(s) 200, as well as portions of the dummy gate 160, and substrate 5 surface. The interlayer dielectric (ILD) 210 can extend above the top surface of the dummy gate 160, and chemical-mechanical polishing (CMP) can be utilized to remove the excess material and provide a smooth, flat surface. In various embodiments, the interlayer dielectric (ILD) 210 can be silicon oxide or a low-k dielectric, where the ILD can be formed by CVD, LPCVD, or spun on. In various embodiments, a low-k dielectric material can be a fluoride-doped silicon oxide (e.g., fluoride doped glass), a carbon-doped silicon oxide, a porous silicon oxide, a spin-on silicon based polymeric material (e.g., tetraethyl orthosilicatehydrogen (TEOS), silsesquioxane (HSQ) and methylsilsesquioxane (MSQ)), or combinations thereof.

Figure 10:
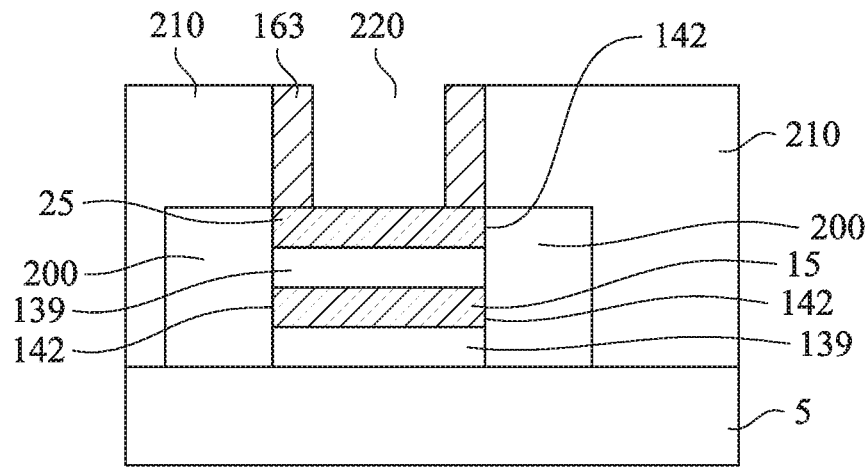
FIG. 10 illustrates a step of a method of forming a device of the disclosure, in accordance with some embodiments.

FIG. 10 is a cross-sectional side view of an interlayer dielectric on the cut-multilayer stack 155 after removal of the dummy gate fill 167 and first and third layers 10 and 20, in accordance with embodiments of the present disclosure. In one or more embodiments, the dummy gate fill 167 of the dummy gate 160 is removed to expose the underlying cut-multilayer stack 155, where the dummy gate fill can be selectively removed. Selective removal of the dummy gate fill 167 exposes at least a portion of the underlying first through fourth layers 10, 15, 20, 25. The side spacer 163 can remain around at least a portion of the cut-multilayer stack 155 to provide a defined opening 220 for formation of an active gate structure. In one or more embodiments, the dummy gate fill 167 can be removed by an isotropic etch, for example, a wet etch, that is selective for the material of the dummy gate fill 167 relative to the side spacer 163, first and third layers 10 and 20 and second and fourth layers 15 and 25. Subsequent to removal of dummy gate fill 167, removal of intervening first and third layers 10 and 20 frees second and fourth layers 15 and 25, in accordance with embodiments of the present disclosure. In one or more embodiments, the remaining portions of the first and third layers 10 and 20 of the cut-multilayer stack 155 are removed to release the second and fourth layers 15 and 25, where the second and fourth layers 15 and 25 can be secured at the opposite end faces to the source/drain regions 200. The second and fourth layers 15 and 25 can span the distance between the two source/drain regions 200 on opposite sides of dummy gate 160. Removal of the first and third layers 10 and 20 can form air gaps 139 between the second and fourth layers 15 and 25, where the second and fourth layers 15 and 25 can be exposed on the four sides not in direct contact with the source/drain regions 200 at opposite end faces 142. In one or more embodiments, the first and third layers 10 and 20 are removed using an isotropic etch, for example, a wet etch selective for the material of the first and third layers 10 and 20. In various embodiments, the etchant can be introduced into the opening 220, such that the etchant can access the sides of the cut-multilayer stack 155 including the sidewalls of first and third layers 10 and 20. In various embodiments, a first layer 10 is between the substrate 5 and the second layer 15, so a subsequently formed gate electrode (e.g., gate fill layer) can wrap around the second layer 15.

Figure 11:
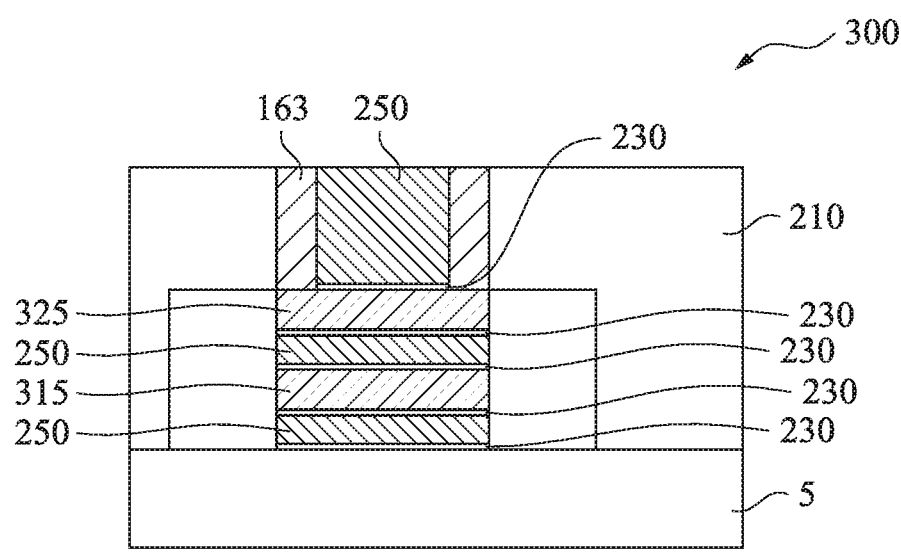
FIG. 11 illustrates a device of the disclosure in accordance with some embodiments.

FIG. 11 is a cross-sectional side view of a nanosheet device 300 in accordance with disclosed embodiments. Nanosheet device 300 includes gate dielectric layer 230 and gate fill layer 250 on the exposed surfaces of the second and fourth layers 15 and 25, in accordance with embodiments of the present disclosure. In one or more embodiments, a gate dielectric layer 230 is formed on the exposed surfaces of the second and fourth layers 15 and 25, where the gate dielectric layer 230 can be formed by a conformal deposition process, for example, ALD, CVD, or combinations thereof. In various embodiments, the precursors for the gate dielectric layer 230 can be selected based on the ability of entering the spaces formed between the second and fourth layers 15 and 25 vacated by the first and third layers 10 and 20. In one or more embodiments, the precursors for the gate dielectric layer 230 can be introduced into the opening 220.

In one or more embodiments, the gate dielectric layer 230 is formed on the exposed surfaces of the substrate 5 on opposite sides of the cut-stack 155 at the bottom of the opening 220 within the side spacer 163. The gate dielectric layer 230 is also formed on the inside surfaces of the side spacer 163. In one or more embodiments, the gate dielectric layer 230 can be an insulating dielectric layer, for example, a silicon oxide (SiO), silicon nitride (SiN), silicon oxynitride (SiON), a high-K dielectric, or a suitable combination of these materials.

In various embodiments, the gate dielectric layer 230 can be a high-K dielectric material that can include, but is not limited to, transition metal oxides such as hafnium oxide (e.g., $HfO_2$), hafnium silicon oxide (e.g., $HfSiO_4$), hafnium silicon oxynitride ($Hf_wSi_xO_yN_z$), lanthanum oxide (e.g., $La_2O_3$), lanthanum aluminum oxide (e.g., $LaAlO_3$), zirconium oxide (e.g., $ZrO_2$), zirconium silicon oxide (e.g., $ZrSiO_4$), zirconium silicon oxynitride ($Zr_wSi_x$—$O_yN_z$), tantalum oxide (e.g., $TaO_2$, $Ta_2O_5$), titanium oxide (e.g., $TiO_2$), barium strontium titanium oxide (e.g., $BaTiO_3$—$SrTiO_3$), barium titanium oxide (e.g., $BaTiO_3$), strontium titanium oxide (e.g., $SrTiO_3$), yttrium oxide (e.g., $Y_2O_3$), aluminum oxide (e.g., $Al_2O_3$), lead scandium tantalum oxide ($Pb(Sc_xTa_{1-x})O_3$), and lead zinc niobate (e.g., $PbZn_{1/3}Nb_{2/3}O_3$). The high-K material can further include dopants such as lanthanum and/or aluminum. The stoichiometry of the high-K compounds can vary.

In one or more embodiments, a work function layer can be formed on the gate dielectric layer 230, where the work function layer and gate dielectric layer 230 can surround at least a portion of each of the second and fourth layers 15 and 25. A work function layer can be formed on the exposed portion(s) of the gate dielectric layer 230 between the second and fourth layers 15 and 25. The work function layer can be formed on the gate dielectric layer 230 to adjust the electrical properties of a gate electrode. In various embodiments, the work function layer is optional. A portion of the work function layer can be formed on the gate dielectric layer 230 on the substrate 5 beneath the bottom-most second layer 15. In one or more embodiments, the work function layer can fill in the spaces between the gate dielectric layer 230 on the second and fourth layers 15 and 25. The work function layer can be formed by a conformal deposition, for example, ALD.

In various embodiments, a work function layer can be a conductive nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a conductive carbide, including but not limited to titanium carbide (TiC), titanium aluminum carbide (TiAlC), tantalum carbide (TaC), hafnium carbide (HfC); or combinations thereof. The work function layer can include multiple layers of work function materials, for example, a work function layer can be a TiN/TiC stack.

In various embodiments, the work function layer can have a thickness in the range of about 3 nm to about 11 nm, or can have a thickness in the range of about 5 nm to about 8 nm.

In one or more embodiments, gate fill layer 250 is formed on the gate dielectric layer 230 and/or optional work function layer if present, where the gate fill layer 250 can fill in the space of opening 220 in between side spacers 163. The gate fill layer 250, gate dielectric layer 230, and optionally the work function layer form a gate structure on one or more second and fourth layers 15 and 25, where the gate fill layer 250 and optional work function layer form a conductive gate electrode. In various embodiments, the gate fill layer 250 is blanket deposited on the exposed surfaces of the gate dielectric layer 230 and/or work function layer. The formed gate fill layer 250 can extend above the top surface of the interlayer dielectric 210, where the gate fill layer material above the top surfaces of the interlayer dielectric 210 can be removed by a CMP to provide a flat, uniform surface. In various embodiments, the gate fill layer 250 can be a conductive metal, where the metal can be tungsten (W), titanium (Ti), molybdenum (Mo), cobalt (Co), or a conductive carbon material (e.g., carbon nanotube, graphene, etc.), or any suitable combinations thereof.

In one or more embodiments, the gate dielectric layer 230 and the optional work function layer wrap around each of the second and fourth layers 15 and 25 which form channels in the nanosheets 315 and 325, respectively. Gate fill layer 250 surrounds each nanosheet channel 315 and 325 (formed in second and fourth layers 15 and 25), the gate dielectric layer 230, and optional work function layer. The gate dielectric layer 230 can extend up the inside surface of the side spacer 163, and the interlayer dielectric (ILD) 210 can be on the outside surface of the sidewall spacer 163.

In various embodiments, electrical contacts can be formed to the gate structure and source/drain regions 200 of nanosheet device 300.

In some embodiments of FIG. 11, a second nanosheet 325 is formed over, and aligned with, a first nanosheet 315 on a substrate. In certain embodiments, a third nanosheet is formed over, and aligned with, the second nanosheet. In other embodiments, the multiple nanosheets are not arranged in a stacked configuration. For example, a second nanosheet is formed laterally adjacent to, and aligned with, a first nanosheet on a substrate. In certain embodiments, a third nanosheet is formed laterally adjacent to and aligned with, the second nanosheet.

Embodiments of the present disclosure, therefore, include methods comprising forming a first layer 10 of a group IV semiconductor on a substrate 5; forming a second layer 15 of germanium on the first layer 10; and forming a first nanosheet 315 by removing a portion of the first layer 10.

Further embodiments of the present disclosure include a structure comprising a substrate 5, and a first germanium nanosheet 315 on the substrate 5, the first germanium nanosheet 315 being spaced apart from the substrate 5, and the first germanium nanosheet 315 comprising a first channel region. In some embodiments, the first nanosheet 315 is between the source and drain 200.

In some embodiments, the first and third layers 10, 20 are removed by selective wet etching. In some embodiments, portions of the first and third layers 10, 20 are removed using an alkaline solution. In some embodiments, the alkaline solution comprises ammonium hydroxide ($NH_4OH$).

In some embodiments, the concentration of the alkaline solution ranges from about 1% to about 50%. In some embodiments, the temperature at which the first and third layers 10 and 20 are contacted with the alkaline solution ranges from about 5° C. to about 100° C. In some embodiments, the alkaline solution is contacted with the first and third layer 10 and 20 for a length of time ranging from about 5 minutes to about 40 minutes. In some embodiments, the contact time ranges from about 5 minutes to about 30 minutes.

In some embodiments, the first and third layers 10, 20 are SiSn and the concentration of the alkaline solution ranges from about 1% to about 50%. In some embodiments, the first and third layers 10, 20 are SiSn and the temperature at which the first and third layers 10, 20 are contacted with the alkaline solution ranges from about 5° C. to about 100° C. In some embodiments, the first and third layers 10, 20 are SiSn and are contacted with the alkaline solution for a length of time ranging from about 5 minutes to about 30 minutes. In some embodiments, the first and third layers 10, 20 are SiSn, the concentration of the alkaline solution ranges from about 1% to about 50%, and the temperature at which the first and third layers 10, 20 are contacted with the alkaline solution ranges from about 5° C. to about 100° C. In further embodiments, the first and third layers 10, 20 are SiSn, the concentration of the alkaline solution ranges from about 1% to about 50%, and the contact time ranges from about 5 minutes to about 30 minutes. In particular embodiments, the first and third layers 10, 20 are SiSn, the temperature at which the first and third layers 10, 20 are contacted with the alkaline solution ranges from about 50° C. to about 100° C., and the contact time ranges from about 5 minutes to about 30 minutes. In specific embodiments, the first and third layers 10, 20 are SiSn, the concentration of the alkaline solution ranges from about 1% to about 50%, the temperature ranges from about 50° C. to about 100° C., and the contact time ranges from about 5 minutes to about 30 minutes.

In some embodiments, the first and third layers 10, 20 are SiGeSn and the concentration of the alkaline solution ranges from about 1% to about 50%. In some embodiments, the first and third layers 10, 20 are SiGeSn and the temperature at which the first and third layers 10, 20 of SiGeSn are contacted with the alkaline solution ranges from about 50° C. to about 100° C. In some embodiments, the first and third layers 10, 20 are SiGeSn and the length of time of the first and third layers 10, 20 of SiGeSn are contacted with the alkaline solution ranges from about 5 minutes to about 30 minutes. In some embodiments, the first and third layers 10, 20 are SiGeSn, the concentration of the alkaline solution ranges from about 1% to about 50%, and the temperature at which the first and third layers 10, 20 of SiGeSn are contacted with the alkaline solution ranges from about 50° C. to about 100° C. In further embodiments, the first and third layers 10, 20 are SiGeSn, the concentration of the alkaline solution ranges from about 1% to about 50%, and the contact time ranges from about 5 minutes to about 30 minutes. In particular embodiments, the first and third layers 10, 20 are SiGeSn, the temperature at which the first and third layers 10, 20 of SiGeSn are contacted with the alkaline solution ranges from about 50° C. to about 100° C., and the contact time ranges from about 5 minutes to about 30 minutes. In specific embodiments, the first and third layers 10, 20 are SiGeSn, the concentration of the alkaline solution ranges from about 1% to about 50%, the temperature at which the first and third layers 10, 20 of SiGeSn are contacted with the alkaline solution ranges from about 50° C. to about 100° C., and the contact time of the sample ranges from about 5 minutes to about 30 minutes.

In some embodiments, the alkaline solution comprises $NH_4OH$ and $H_2O$. In further embodiments, the alkaline solution comprises $NH_4OH$ and $H_2O$ in a ratio ranging from about 1:6 to about 1:12. In some embodiments, the alkaline solution comprises $NH_4OH$ and $H_2O$ in a ratio ranging from about 1:8 to about 1:10. In various embodiments, the alkaline solution comprises $NH_4OH$ and $H_2O$ in a ratio of about 1:9. In some embodiments, the first and third layers 10, 20 are SiSn and the alkaline solution comprises $NH_4OH$. In other embodiments, the first and third layers 10, 20 are SiGeSn and the alkaline solution comprises $NH_4OH$.

A cross section of a germanium nanosheet described herein can have any suitable shape. For example, a cross section of a germanium nanosheet may have a substantially rectangular shape. In other embodiments, the cross section of a germanium nanosheet is a substantially trapezoidal shape. In other embodiments, the cross section of a germanium nanosheet has a circular shape. In other embodiments, the cross section of a germanium nanosheet has an ovular shape.

Figure 12:
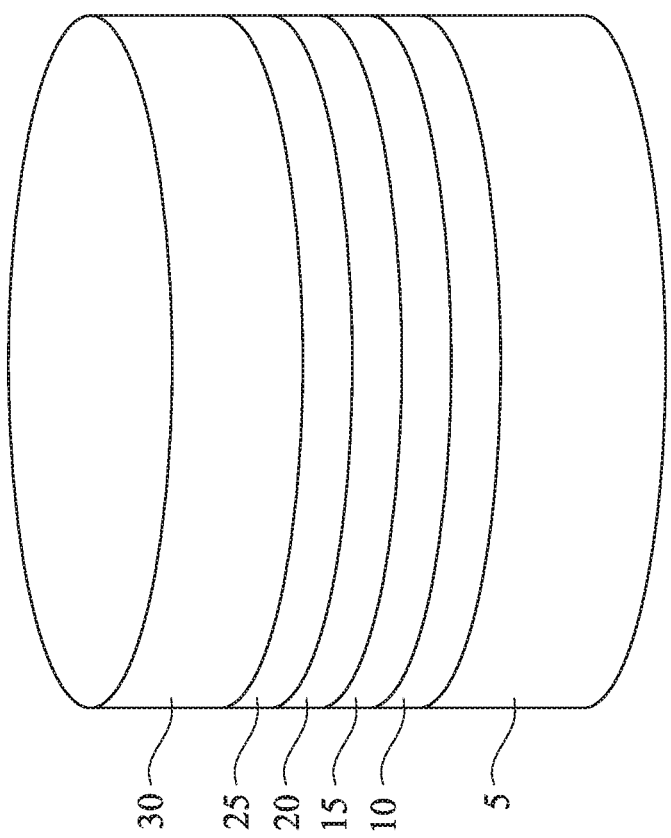
FIG. 12 illustrates a step of a method of forming a device of the disclosure, in accordance with some embodiments.

In an alternate embodiment of a method of the disclosure, the process proceeds to the step illustrated in FIG. 12 after the processing step shown in FIG. 4. As shown in FIG. 12, an insulating layer 30 is formed on the heterostructure 35 of alternating layers. In other words, after the stack 35 of alternating layers of a group IV semiconductor and layers of germanium are formed, a layer of an insulator 30 is formed. In various embodiments, the layer of the insulator 30 is formed on the fourth layer 25.

Any suitable insulator that provides adequate protection for the next processing steps may be used. In some embodiments, the insulator layer 30 comprises silicon (Si). In some embodiments, the insulator comprises silicon dioxide ($SiO_2$). In other embodiments, the insulator layer 30 comprises hafnium (Hf). In some embodiments, the insulator layer 30 comprises hafnium oxide ($HfO_2$).

The insulator layer 30 can be formed using any suitable method. For example, in various embodiments, insulator layer 30 is formed using PECVD.

In some embodiments, the thickness of the insulator layer 30 ranges from about 10 nm to about 500 nm. In some embodiments, the thickness of the insulator layer 30 ranges from about 20 nm to about 250 nm.

Figure 13:
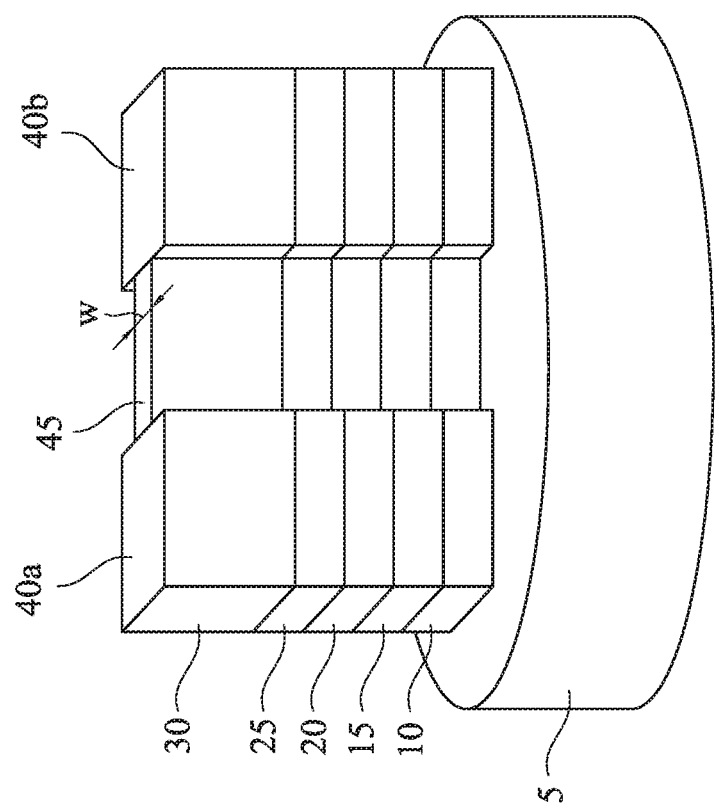
FIG. 13 illustrates a step of a method of forming a device of the disclosure, in accordance with some embodiments.

As shown in FIG. 13, the stack is shaped such that it includes two wide portions, or pads, 40a, 40b connected by a narrow portion 45. In some embodiments, the stack is shaped by forming a pattern on the stack and removing the material around the pattern. In various embodiments, the pattern is a photoresist. Any suitable etching process may be used, for example reactive-ion etching (RIE). In particular embodiments, RIE is used to remove the material around the pattern.

In some embodiments, the width of the narrow portion 45 ranges from about 1 micrometer (μm) to about 10 μm. In various embodiments, the wide portions 40a, 40b will be processed to form pads 40a, 40b for electrical contact and the narrow portion 45 will be processed to form the nanosheet(s).

In some embodiments, the width w of the resulting narrow region 45 ranges from about 3 μm to about 7 m. In various embodiments, narrow region 45 is about 5 m wide.

Pads 40a, 40b can be any suitable shape. In various embodiments, pads 40a, 40b are substantially rectangular. In some embodiments, the pads 40a, 40b are substantially square. In other embodiments, the pads 40a, 40b are substantially ovular. In some embodiments, the pads 40a, 40b are substantially circular.

Figure 14:
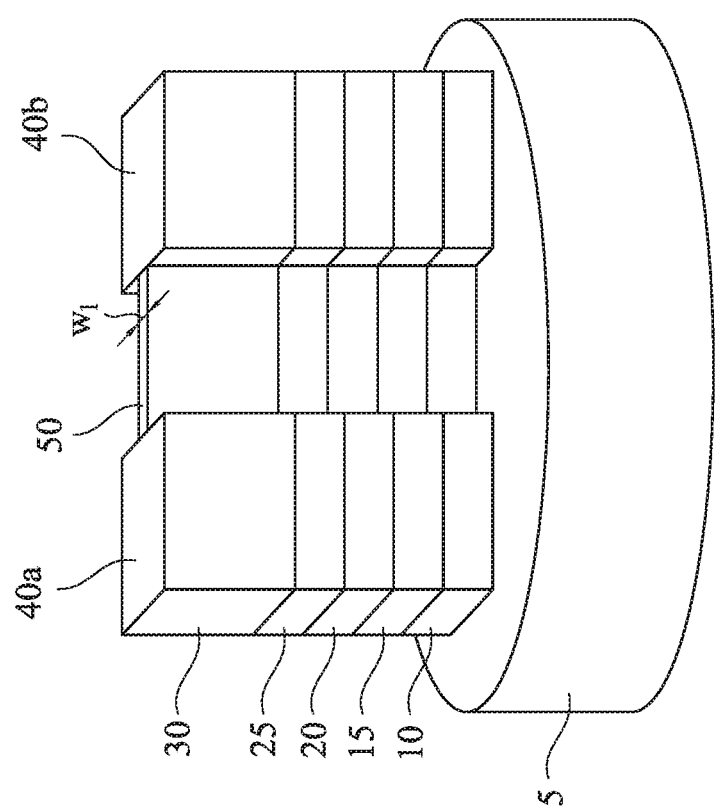
FIG. 14 illustrates a step of a method of forming a device of the disclosure, in accordance with some embodiments.

As shown in FIG. 14, the sample undergoes further processing to narrow the narrow region 45. In some embodiments, the narrow region 45 is shaped to form a nanosheet region 50. Any suitable technique may be used to shape the narrow region 45 (e.g., focused ion beam (FIB)). In various embodiments, the narrow region 45 is shaped by FIB.

In some embodiments, the width $w_1$ of the resulting nanosheet region 50 ranges from about 1 nm to about 100 nm. In various embodiments, the width of the nanosheet region 50 ranges from about 2 nm to about 20 nm. In particular embodiments, the width of the nanosheet region 50 ranges from about 5 nm to about 10 nm.

Figure 15:
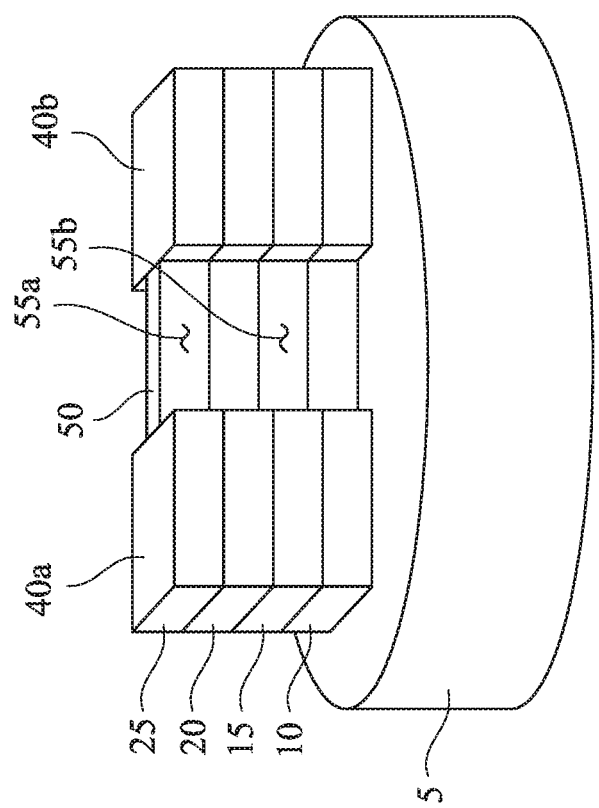
FIG. 15 illustrates a step of a method of forming a device of the disclosure, in accordance with some embodiments.

As shown in FIG. 15, the insulating layer 30 is removed. The insulating layer 30 may be removed using any suitable technique (e.g., etching). In some embodiments, the insulating layer 30 is removed using an etching solvent. Any suitable etching solvent (e.g., a hydrofluoric acid (HF) solution) can be used. In some embodiments, the etching solvent is a HF solution. In some embodiments, the insulating layer 30 is removed using a buffered oxide etch (BOE).

In some embodiments, a first channel 55a and a second channel 55b are formed in the nanosheet region 50 of the second and fourth layers 15, 25, respectively.

Figure 16:
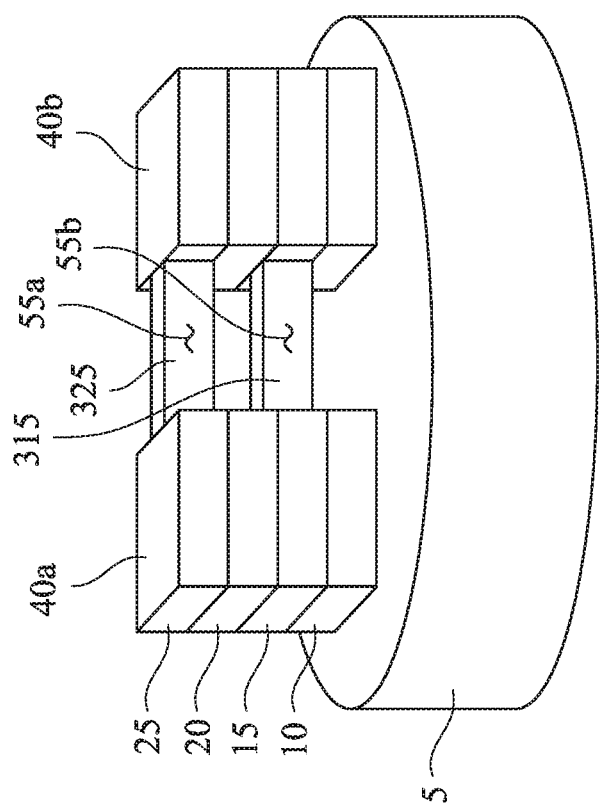
FIG. 16 illustrates a step of a method of forming a device of the disclosure, in accordance with some embodiments.

After the insulating layer 30 is removed, the first and third layers 10, 20 of the group IV semiconductor are removed to form the nanosheets 315, 325, by exposing surfaces of nanosheets, as shown in FIG. 16.

In some embodiments, the first and third layers 10, 20 are removed by selective wet etching. In some embodiments, the first and third layers 10, 20 are removed using an alkaline solution. In some embodiments, the alkaline solution comprises ammonium hydroxide ($NH_4OH$).

FIGS. 17A-17F show cross-sectional views of the structure at this stage of processing.

Figure 17B:
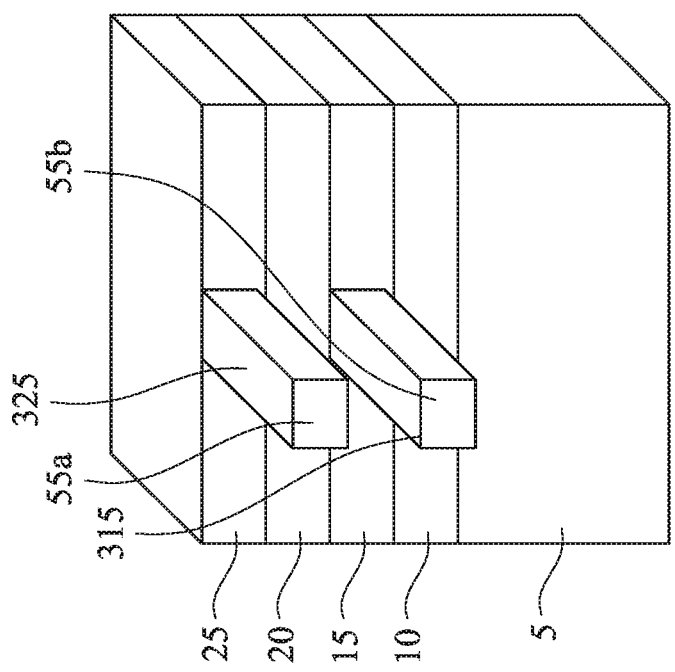
FIGS. 17A-17F show cross-sectional views of the sample at this stage of processing.
Figure 17A:
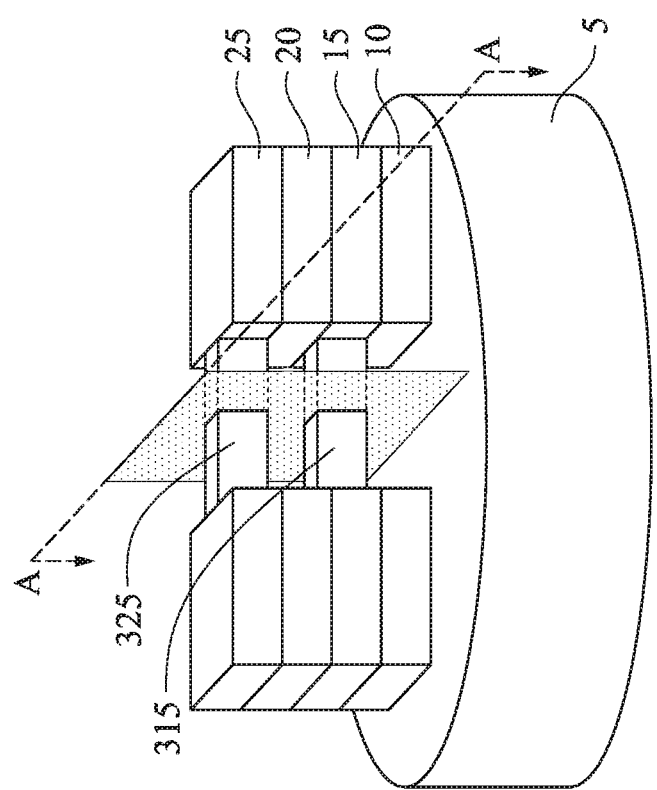

FIG. 17A shows a perspective view of the structure with line A-A marked. FIG. 17B shows a perspective view of the cross section of the structure of FIG. 17A at line A-A.

A cross section of a germanium nanosheet described herein can have any suitable shape. For example, a cross section of a germanium nanosheet may have a substantially rectangular shape, as shown in FIG. 17B. In other embodiments, the cross section of a germanium nanosheet is a substantially trapezoidal shape. In other embodiments, the cross section of a germanium nanosheet has a circular shape. In other embodiments, the cross section of a germanium nanosheet has an ovular shape.

In some embodiments, a first channel 55a is formed in germanium nanosheet 315 and a second channel 55b is formed in germanium nanosheet 325, as illustrated in FIG. 17B.

Figure 17D:
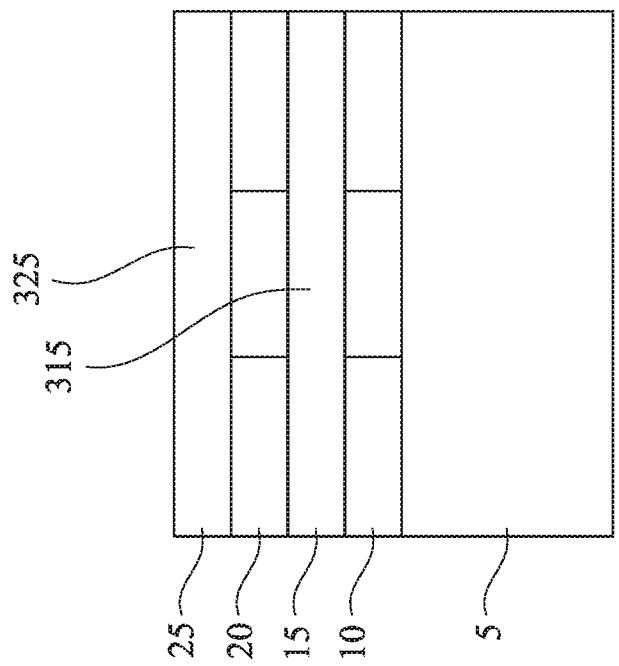
Figure 17C:
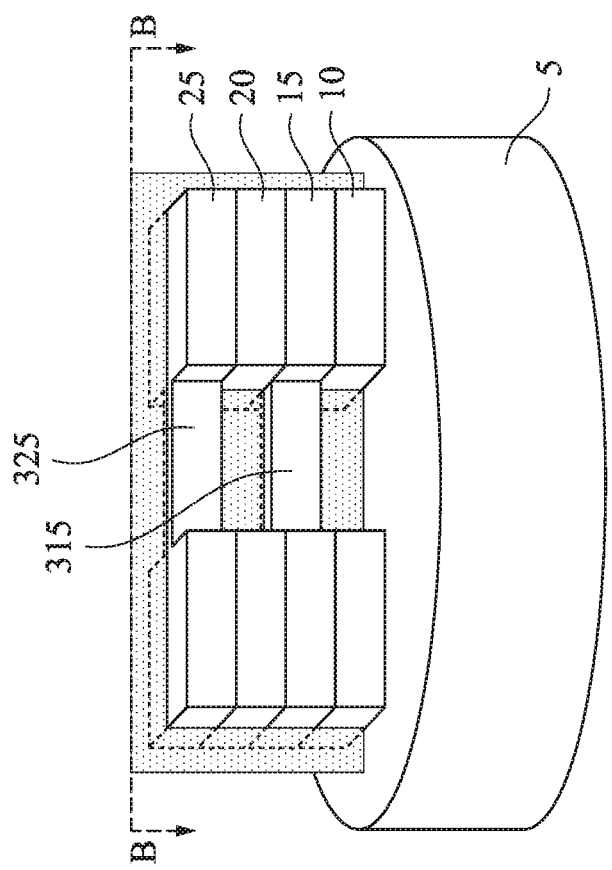
Figure 17F:
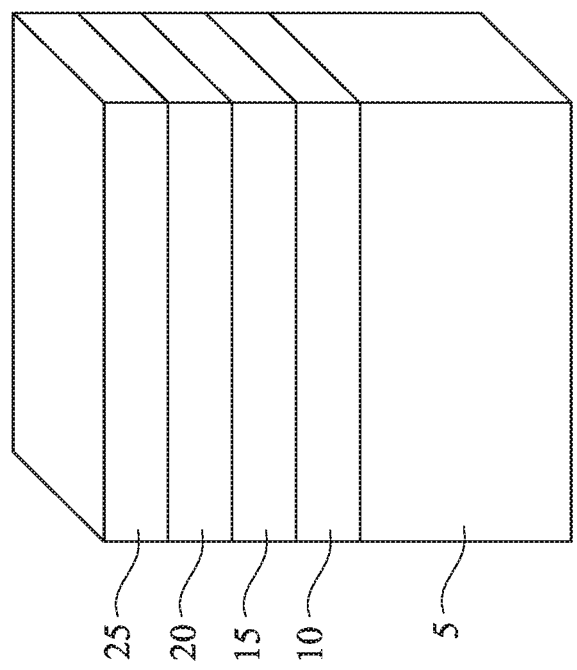
Figure 17E:
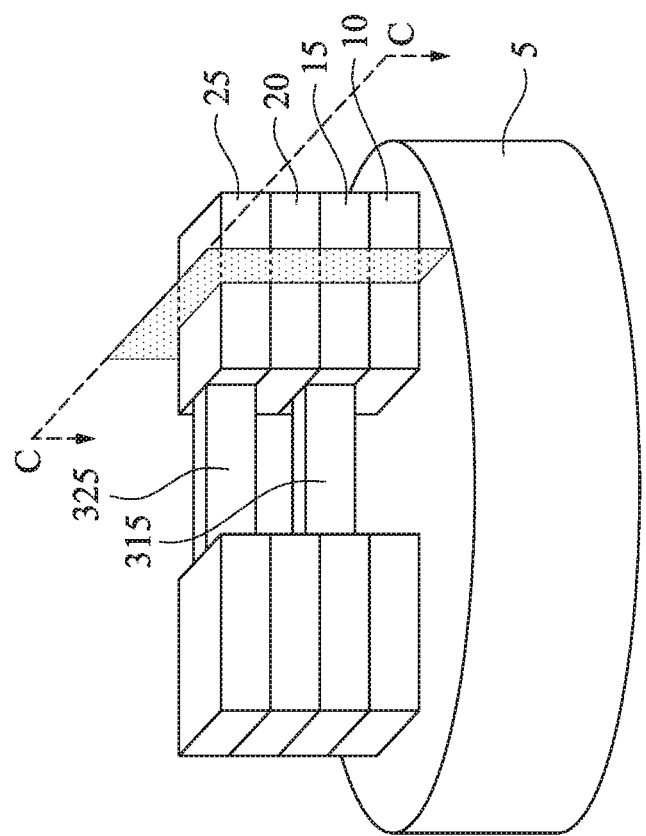

FIG. 17C shows a perspective view of the sample with line B-B marked. FIG. 17D shows a perspective view of the cross section of the sample of FIG. 17C at line B-B. FIG. 17E shows a perspective view of the sample with line C-C marked. FIG. 17F shows a perspective view of the cross section of the sample of FIG. 17E at line C-C.

Figure 18:
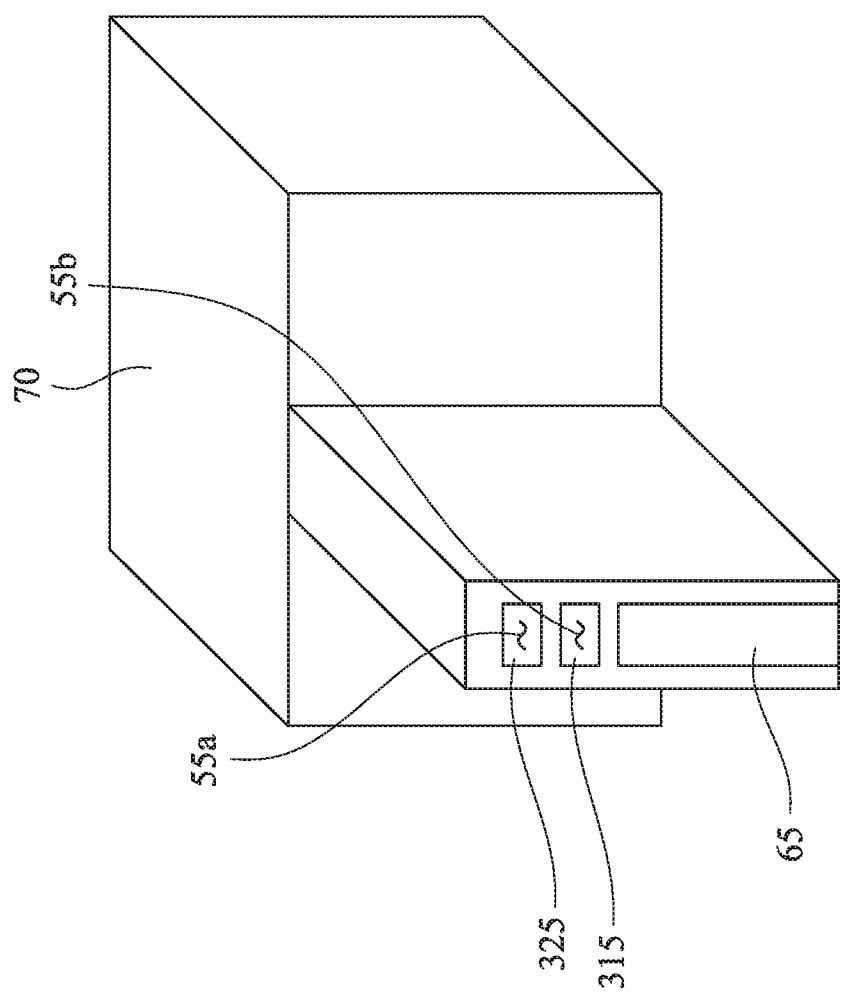
FIG. 18 illustrates a step of a method of forming a device of the disclosure, in accordance with some embodiments.

The substrate 5, or a portion thereof, may then be etched, as seen in FIG. 18, which shows a perspective view of a cross section similar to the view shown in FIG. 17B. Any suitable etching process may be used, for example RIE.

In various embodiments, a portion of the substrate forms a pillar 65 that is aligned with the nanosheets 315, 325. In some embodiments, pillar 65 has substantially the same width as the nanosheets 315, 325.

Figure 19:
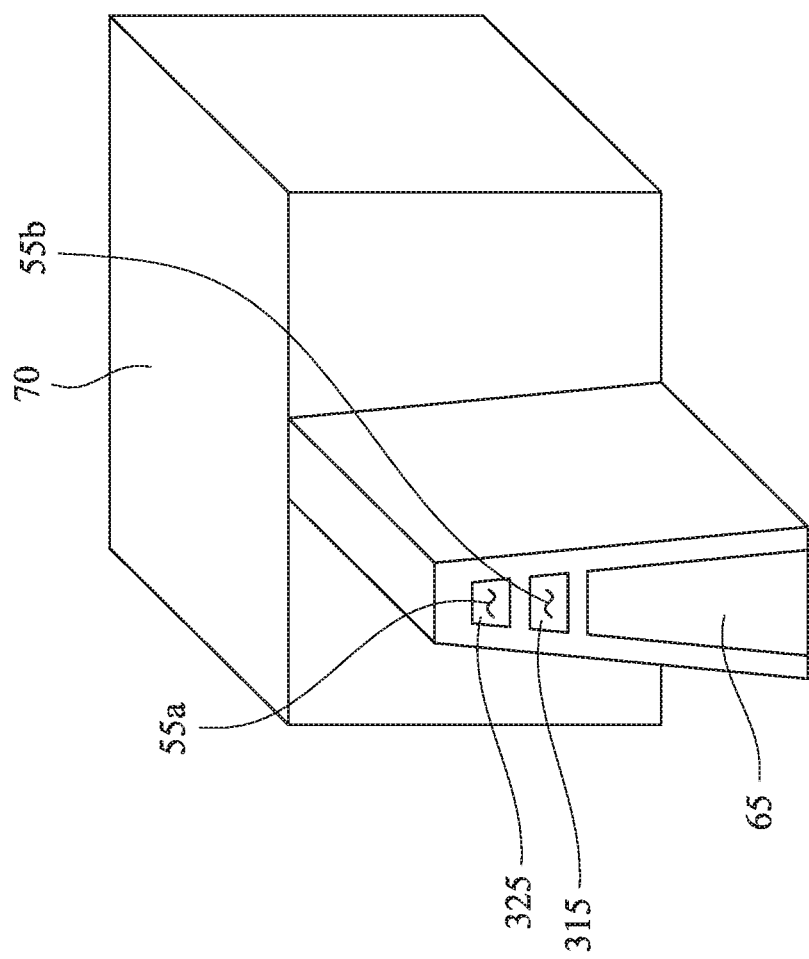
FIG. 19 illustrates a step of a method of forming an alternate device of the disclosure, in accordance with some embodiments.

In other embodiments, the width of pillar 65 changes through the height of the pillar 65. In some embodiments, pillar 65 has a substantially trapezoidal shape, as shown in FIG. 19. In some embodiments, the cross-section of at least one germanium nanosheet 315 is substantially trapezoidal shaped.

Dielectric layer 70 is then deposited, as shown in FIG. 18 and FIG. 19. In some embodiments, the dielectric layer 70 is conformal over the structure. In some embodiments, the dielectric layer 70 contacts all four faces of the germanium nanosheet(s), as shown in FIG. 18 and FIG. 19. Accordingly, embodiments of the present disclosure include devices comprising a substrate 5; a first pad 40a on the substrate 5; a second pad 40b on the substrate 5; a first germanium nanosheet 315 between the first pad 40a and the second pad 40b; and a dielectric layer 70 surrounding at least a portion of the first germanium nanosheet 315, the dielectric layer 70 being arranged between the substrate 5 and the first germanium nanosheet 315.

In various embodiments, dielectric layer 70 is the gate dielectric in the final device.

Any suitable methods of forming the dielectric layer 70 (e.g., atomic layer deposition (ALD), CVD, etc.) may be used. In particular embodiments, the dielectric layer 70 is deposited by ALD. In other embodiments, the dielectric layer 70 is deposited by CVD.

In some embodiments, dielectric layer 70 may include a thin oxide layer. In some embodiments, dielectric layer 70 is a high-k dielectric material such as $HfO_2$, zirconium oxide, or the like. Other oxides and/or nitrides of Hf, aluminum (Al), lanthanum (La), zirconium (Zr), titanium (Ti), tantalum (Ta), strontium (Sr), lead (Pb), and/or the like, may also be used in dielectric layer 70. In various embodiments, the dielectric layer 70 is aluminum oxide ($Al_2O_3$). In other embodiments, the dielectric layer 70 is $HfO_2$. In other embodiments, the dielectric layer 70 is silicon dioxide.

In some embodiments, the dielectric layer surrounds at least a portion of the four faces of each nanosheet 315, 325. In some embodiments, the dielectric layer 70 surrounds the first channel 55a and the second channel 55b. In some embodiments, the dielectric layer 70 surrounds all of the four faces of each nanosheet 315, 325, as shown in FIG. 18 and FIG. 19.

Figure 20:
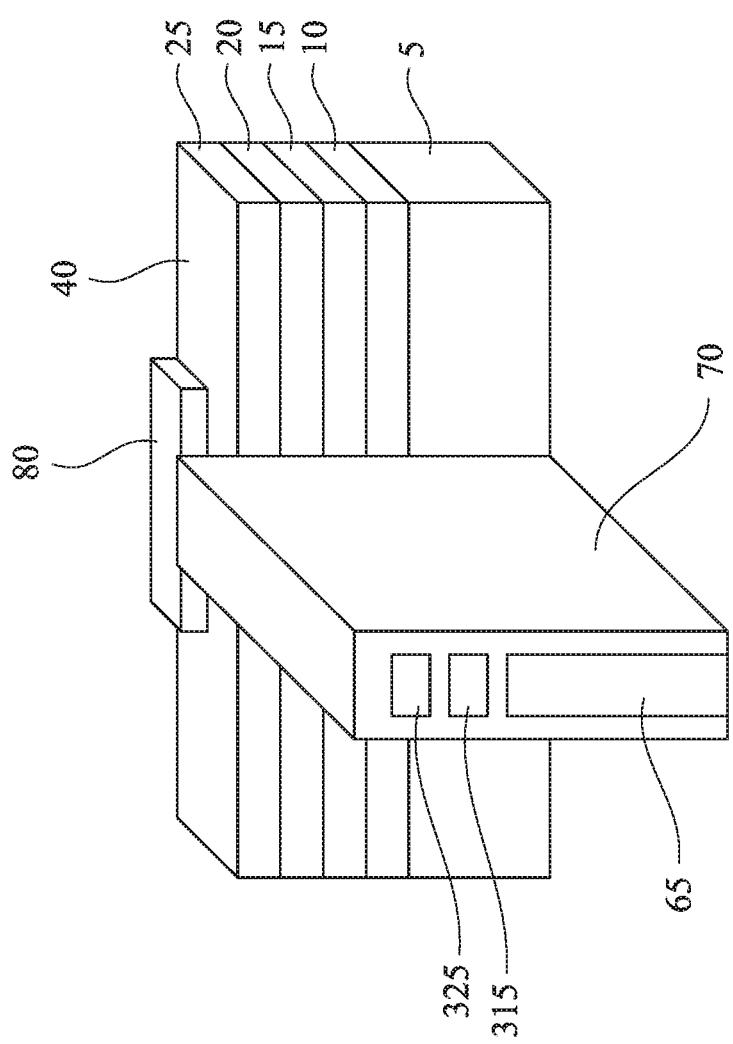
FIG. 20 illustrates a step of a method of forming a device of the disclosure, in accordance with some embodiments.

As shown in FIG. 20, the portion of the dielectric layer 70 that covers the pad 40 of the structure is removed. The portion of the dielectric layer 70 may be removed using any suitable technique (e.g., etching). In some embodiments, the dielectric layer 70 is removed using a suitable etching solvent. In some embodiments, the dielectric layer 70 is removed using a buffered oxide etch (BOE).

After removing the dielectric layer 70, a metal layer 80 is formed. Any suitable metal may be used for metal layer 80 (e.g., nickel, aluminum, gold, platinum, etc.). In some embodiments, metal layer 80 is deposited on the first pad 40, as well as the second pad (not pictured). In some embodiments, a portion of dielectric layer 70 that covers a portion of germanium nanosheets 315, 325 may be removed.

In various embodiments, the structure is further processed to form a gate all around (GAA) transistor. Such GAA transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

In particular embodiments, a metal gate is deposited over at least a portion of dielectric layer 70 on the germanium nanosheets 315, 325. Any suitable method may be used to form a metal gate. In various embodiments, a metal gate is formed using a conformal method. The metal gate may include titanium, tantalum, tungsten, molybdenum, ruthenium, platinum, cobalt, nickel, palladium, niobium, aluminum, copper, or alloys thereof. In some embodiments, the metal gate includes a metal-containing material, such as titanium nitride (TiN), tantalum carbide (TaC), tantalum nitride (TaN), tantalum aluminum carbide (TaAlC), titanium carbide (TiC), Co, Al, titanium aluminide (TiAl), HfTi, titanium silicide (TiSi), tantalum silicide (TaSi), or titanium aluminum carbide (TiAlC).

In some embodiments, the metal gate includes more than one layer of a metal, a metal alloy, a metal-containing material, or a combination thereof. In various embodiments, the metal gate includes a work function metal layer. In some embodiments, the work function metal layer includes one or more layers of metal materials, such as TiN, TaN, TaAlC, TiC, TaC, Co, Al, TiAl, HfTi, TiSi, TaSi, or TiAlC.

Devices that include germanium nanosheets in accordance with embodiments describe herein can be used in high-speed electronic devices to provide improved performance. Devices including the described germanium nanosheets as nanosheet channels provide improved performance over FinFET and FETs that include silicon nanosheets as channels at the same scale. For example, at or beyond the 7 nm node, germanium exhibits a larger electron or hole mobility as compared with silicon, which provides an improved channel/gate performance as compared to Si-based nanosheets. Further, the described germanium nanosheets provide gate-all around FETs with improved performance as compared to a conventional fin field effect transistor (FinFET) in the 7 nm node technology. FETs utilizing the disclosed germanium nanosheets as channels not only exhibit better gate control and larger drain current, but also the described germanium nanosheets have excellent electrostatics and short channel control. Further, using germanium nanosheets disclosed herein in processes for producing FETs circumvent some patterning challenges (e.g., lithographic challenges, implantation challenges, etc.) associated with technology at this scale.

The present disclosure provides, in various embodiments, devices that include a germanium nanosheet including a channel region over a substrate.

The present disclosure further provides devices that include a germanium nanosheet arranged above a substrate and between a source and drain, as well as a dielectric layer arranged between the substrate and the germanium nanosheet. In some embodiments the dielectric layer and a metal layer surround the germanium nanosheet.

Embodiments of the present disclosure further include methods that include forming a layer of a group IV semiconductor on a substrate and a layer of germanium on the layer of the group IV semiconductor, then removing portions of the layer of the group IV semiconductor to provide a germanium nanosheet on the substrate.

Embodiments of the present disclosure further include methods that include receiving a wafer comprising a stack of alternating layers of a group IV semiconductor and layers of germanium on a substrate, shaping the stack to have a narrow portion between a first pad and a second pad, forming a plurality of germanium nanosheets by removing the narrow portion of the layers of the group IV semiconductor; and depositing a dielectric material that surrounds at least a portion of each of the plurality of germanium nanosheets.

Further, the disclosure provides methods that include forming a stack that includes a layer of a group IV semiconductor on a substrate, a layer of germanium on the first layer, a layer of the group IV semiconductor on the second layer, and a layer of germanium on the third layer, and forming nanosheets by selectively wet etching portions of the layers of the group IV semiconductor to expose surfaces of the germanium layers.

Additionally, the present disclosure provides methods that include depositing a heterostructure of alternating layers of germanium a group IV semiconductor that includes tin, shaping the heterostructure to have a first pad connected to a second pad by a narrow portion; and removing the narrow portion of the layers of the group IV semiconductor to form germanium nanosheets.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
forming a first material layer over a substrate;
forming a first semiconductor layer over the first material layer;
forming a second material layer over the first semiconductor layer, wherein the first material layer and the second material layer comprises a semiconductor material, the semiconductor material comprising a group IV semiconductor having tin in a concentration ranging from about 15% to about 25.5%;
forming a second semiconductor layer over the second material layer, wherein the first semiconductor layer and the second semiconductor layer comprises germanium;
patterning the second semiconductor layer, the second material layer, the first semiconductor layer, and the first material layer, thereby forming a stack of nanosheets;
patterning the substrate to form a fin under the stack of nanosheets; and
removing the first material layer and the second material layer.

2. The method of claim 1, wherein the first material layer and the second material layer comprise a silicon-tin compound.

3. The method of claim 1, wherein the fin comprises germanium.

4. The method of claim 1 further comprising, after removing the first material layer and the second material layer, forming a gate dielectric over the first semiconductor layer and the second semiconductor layer.

5. The method of claim 1, wherein patterning the second semiconductor layer, the second material layer, the first semiconductor layer, and the first material layer forms a first pad, a second pad, and a channel region interposed between the first pad and the second pad, wherein a first width of the first pad and a second width of the second pad are greater than a third width of the channel region, wherein the first width, the second width, and the third width are measured in a plan view along a line perpendicular to a longitudinal axis of the channel region in the plan view.

6. The method of claim 1, wherein the fin has sloped sidewalls.

7. The method of claim 1, wherein a first width of the nanosheets of the stack of nanosheets adjacent to the substrate is greater than a second width of the nanosheets of the stack of nanosheets distal from the substrate, wherein the first width and the second width are measured in a direction perpendicular to a longitudinal axis of the stack of nanosheets in a plan view.

8. A method of forming a semiconductor device, the method comprising:
forming a stack of layers over a substrate, the stack of layers comprising a first material layer over the substrate, a first semiconductor layer over the first material layer, a second material layer over the first semiconductor layer, and a second semiconductor layer over the second material layer, wherein the first material layer and the second material layer comprises silicon tin with a concentration of tin between 15% and 20.3%;
patterning the substrate and the stack of layers to form a fin having a stack of nanowires over the fin, the stack of nanowires comprising a first material nanowire on the substrate, a first semiconductor nanowire on the first material nanowire, a second material nanowire on the first semiconductor nanowire, and a second semiconductor nanowire on the second material nanowire, each nanowire of the stack of nanowires comprising a first section, a second section, and a channel region interposed between the first section and the second section;
removing the first material layer and the second material layer in the channel region; and
forming a dielectric layer around the first semiconductor nanowire and the second semiconductor nanowire in the channel region.

9. The method of claim 8, wherein the first semiconductor nanowire and the second semiconductor nanowire comprise germanium.

10. The method of claim 9, wherein the fin comprises undoped germanium.

11. The method of claim 10, wherein the dielectric layer comprises aluminum oxide.

12. The method of claim 8 further comprising thinning the first semiconductor layer and the second semiconductor layer in the channel region.

13. The method of claim 12, wherein the thinning is performed at least in part using a focused ion beam process.

14. The method of claim 12, wherein a width of the first semiconductor layer after thinning is between about 2 nm and about 20 nm.

15. The method of claim 8, wherein a width of the channel region is less than a width of the first section and a width of the second section.

16. The method of claim 8, wherein the first material layer and the second material layer are removed by a selective wet etching using an alkaline solution comprising ammonium hydroxide ($NH_4OH$).

17. A method of forming a semiconductor device, the method comprising:
forming a stack of nanosheets over a fin, the stack of nanosheets comprising alternating layers of germanium and a first material, wherein the first material comprises silicon tin with a concentration of tin between 15% and 20.3%, each nanosheet of the stack of nanosheets having a first end portion, a second end portion, and a channel region interposed between the first end portion and the second end portion;
thinning the stack of nanosheets in the channel region in a direction perpendicular to a longitudinal axis of the channel region in a plan view;
removing the layers of the first material in the channel region, wherein the layers of germanium remaining in the channel region; and
forming a gate dielectric on the layers of germanium.

18. The method of claim 17, wherein layers of germanium have a width between about 2 nm and about 20 nm.

19. The method of claim 17, wherein a cross-sectional view of the fin below the channel region of the stack of nanosheets has a trapezoidal shape.

20. The method of claim 17, wherein the fin comprises undoped germanium.

* * * * *